United States Patent
Wu et al.

(10) Patent No.: US 7,589,569 B2
(45) Date of Patent: Sep. 15, 2009

(54) COMPARATOR WITH SELF-BIASED REFERENCE VOLTAGE FOR AN OSCILLATOR

(75) Inventors: Ying-Feng Wu, Taichung County (TW); Che-Ming Wu, Taichung County (TW)

(73) Assignee: G-Time Electronic Co., Ltd., Hsinchu (TW)

( * ) Notice: Subject to any disclaimer, the term of this patent is extended or adjusted under 35 U.S.C. 154(b) by 77 days.

(21) Appl. No.: 11/976,931

(22) Filed: Oct. 30, 2007

(65) Prior Publication Data
US 2008/0100389 A1 May 1, 2008

(30) Foreign Application Priority Data
Oct. 31, 2006 (TW) .............................. 95140306 A

(51) Int. Cl.
*H03K 3/02* (2006.01)
*H03K 5/153* (2006.01)
(52) U.S. Cl. .............................. 327/81; 327/83; 327/85; 331/143

(58) Field of Classification Search ................. 331/111, 331/143–153; 327/50, 77, 80, 81, 83, 85, 327/87, 88, 97
See application file for complete search history.

(56) References Cited

U.S. PATENT DOCUMENTS

| 4,794,278 A | * | 12/1988 | Vajdic | 327/537 |
| 5,760,655 A | * | 6/1998 | Roohparvar | 331/111 |

* cited by examiner

*Primary Examiner*—David Mis
(74) *Attorney, Agent, or Firm*—Rosenberg, Klein & Lee

(57) ABSTRACT

A comparator with a fixed reference voltage (self bias) for an oscillator is disclosed. The comparator includes: a depletion MOS network to form a source current, wherein the gate and the source has a connection; and an enhanced MOS transistor, wherein the drain or the source connects with the depletion MOS transistor in series. The gate of the enhanced MOS transistor receives an input voltage when the input voltage is lower than the reference voltage, and the comparator outputs a high level voltage, or the enhanced MOS transistor outputs a low level voltage if the input voltage is higher then the reference voltage. Moreover, the oscillator's comparator has a reference voltage that is independent from temperature and supply voltage source.

24 Claims, 10 Drawing Sheets

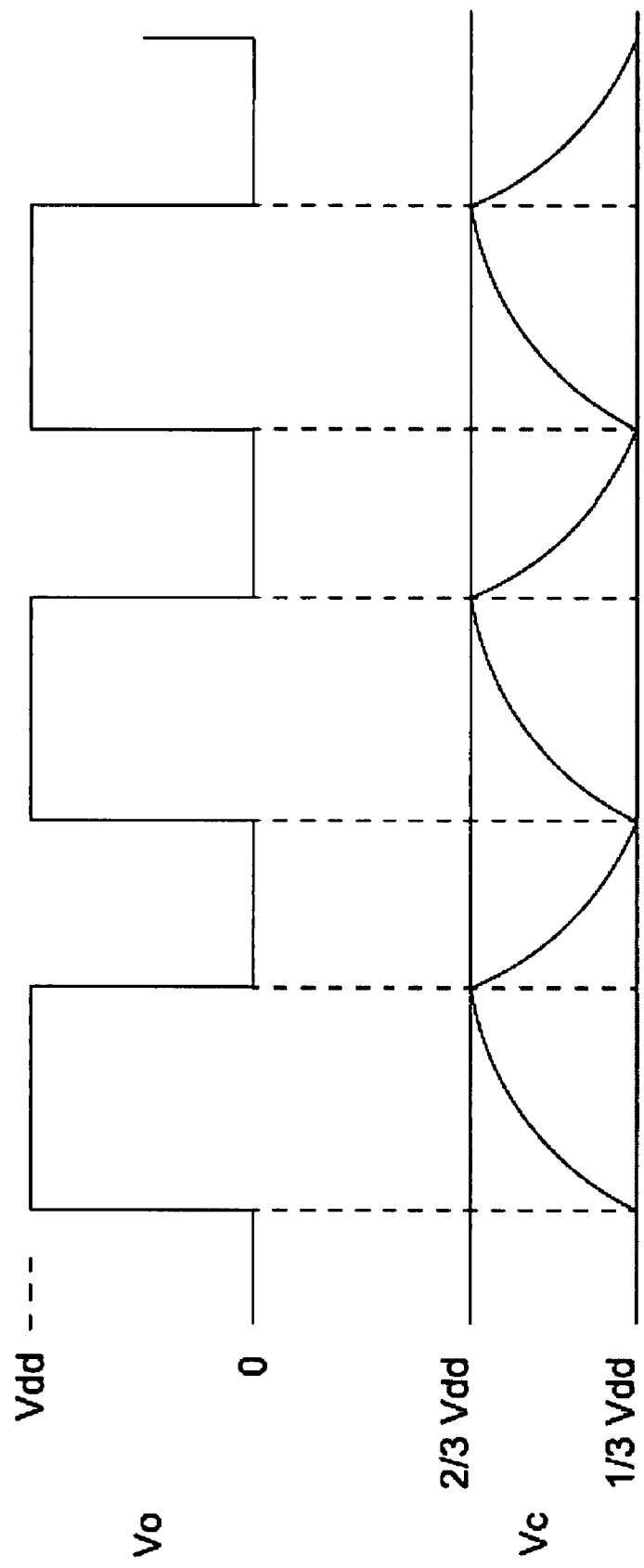
FIG. 2.1 (PRIOR ART)

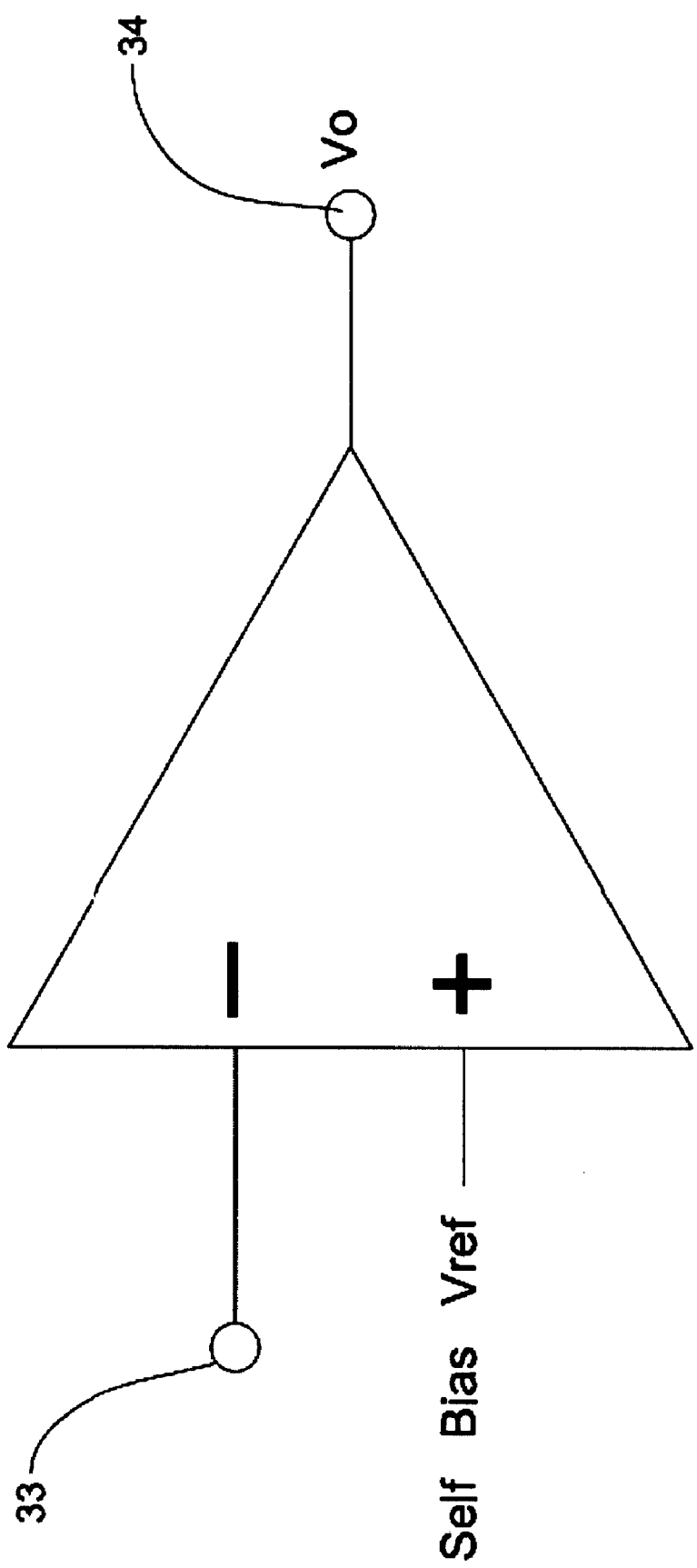
FIG. 3.1

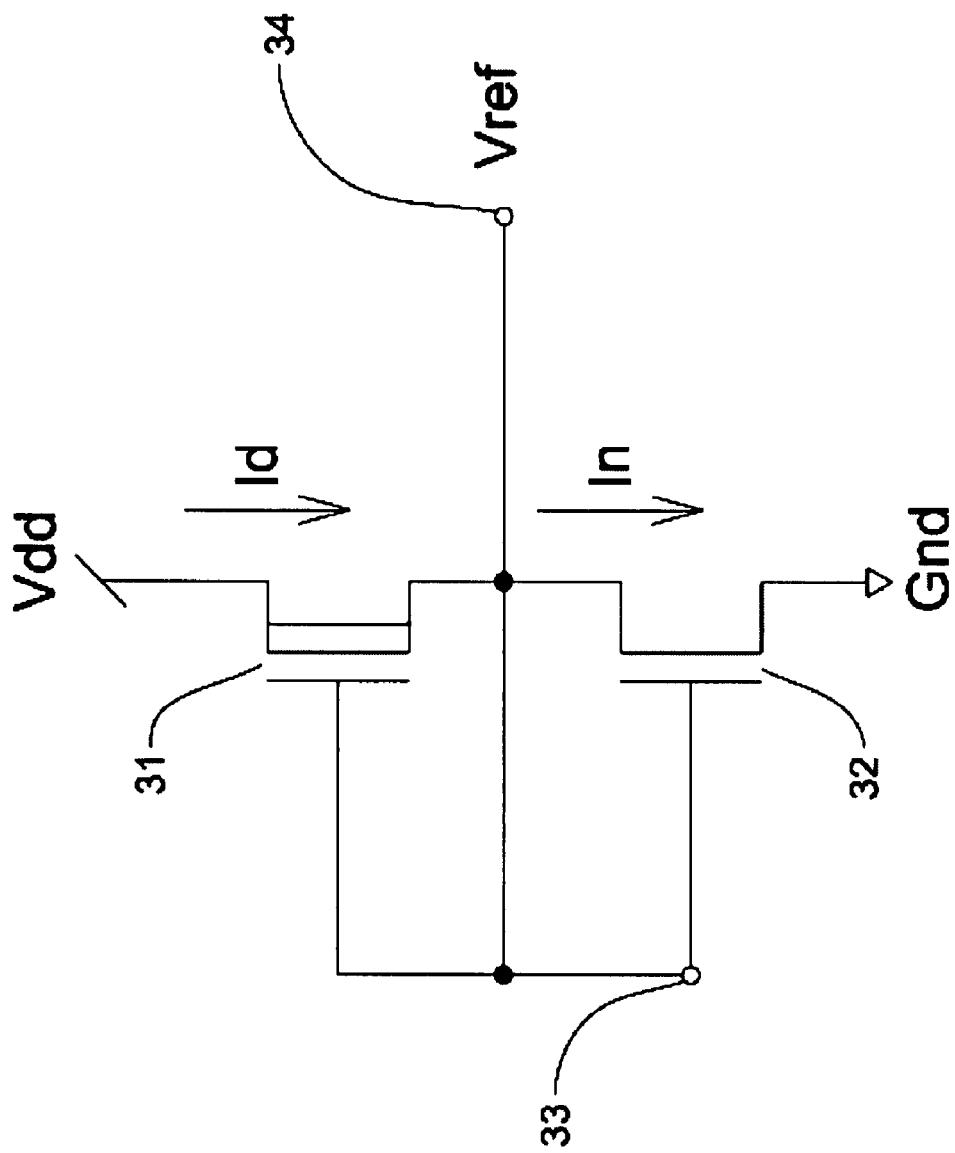
FIG. 3.2

COMPARATOR WITH SELF-BIASED REFERENCE VOLTAGE FOR AN OSCILLATOR

BACKGROUND OF THE INVENTION

1. Field of the Invention

The present invention relates to a comparator, and more especially, to a comparator with a self-biased reference voltage for an oscillator.

2. Background of the Related Art

Recently, due to the rapid progress of mobile communication apparatuses such as the cellular phones, apparatuses require many additional functions including temperature compensation, size reduction, and frequency raising, and so on. An oscillator is generally used in the phase-locked loop, frequency synthesizer and frequency generator circuits. A variety of methods are known for creating the oscillator circuits for providing periodic signals with a desired frequency.

The electronic oscillator is an electronic circuit that produces a repetitive electronic signal, often a sine wave or a square wave. FIG. 1 shows a circuit diagram of a conventional close loop oscillator. The close loop oscillator 100 satisfies Barkhausen Criteria, the loop gain satisfies $A(j\omega_0)\beta(j\omega_0)=1$, phase shift is $0(\angle A(j\omega_0)\beta(j\omega_0)=0°)$, and it will oscillate at the frequency $\omega_0$.

The close loop oscillator circuit has a variety of applications, but is not limited to, such as the harmonic oscillator, relaxation oscillator, and crystal oscillator.

Firstly, the harmonic oscillator uses the self-oscillation to produce the sine wave without adding an external signal. The basic principal of the operation is to connect the output of a filter to an amplifier, and the output of the amplifier is coupled back to the filter's input. Therefore, those noisy signals are transmitted to the filter to filter out a portion of frequency and output them, and then the output signals is amplified by amplifier and entered into filter again and again, until the needed frequency is produced.

In practice, the harmonic oscillator can have different filtering methods and amplifies to realize the theory, like the Hartley oscillator, Colpitts oscillator, Clapp oscillator, Pierce crystal oscillator, phase shift oscillator, RC oscillator and Wien-Bridge oscillator, and so on.

In addition, relaxation oscillators or multivibrators are known in the monolithic integrated circuit design. The conventional relaxation oscillators operate by alternately charging and discharging a timing capacitor between two internally set threshold voltage levels. This results in the generation of a periodic output signal waveform whose frequency is inversely proportional to the capacitance value of the timing capacitor. The conventional relaxation oscillator configuration includes R-C charge and discharge oscillators, constant-current charge and discharge oscillators and emitter-coupled multivibrators.

Crystal oscillators have long been used to provide very accurate time keeping function because of their steady and predictable response to the physical or electrical stimuli. However, by their very nature, they do not have wide range of frequency.

For increasing the modulation capability of the oscillator, the researches usually use a modulated voltage to control the oscillator are populated. A voltage-controlled oscillator or VCO is an electronic oscillator designed to control the oscillation frequency by a voltage input. The frequency of oscillation is varied by the applied DC voltage, while the modulation signals may also be fed into the VCO to cause frequency modulation (FM) or phase modulation (PM); a VCO with digital pulse output may similarly have its repetition rate (FSK, PSK) or pulse width modulated (PWM).

Noticeably, no matter how progressive the oscillator is. The use of electric unit in the oscillator to charge or discharge naturally cannot avoid the noise, and always is affected by the input voltage, sometimes the characteristic of the frequency will change when the temperature varies. In FIG. 2, a conventional oscillator circuit is shown. An oscillator 200 includes an upper comparator 210, a lower comparator 220, an inverter 230, a discharge transistor 240, an inverter driven stage 250, a first resistor 260a, a second resistor 260b. a third resistor 260c, a first match resistor 270, a second match resistor 280 and a capacitor 290. Wherein all resistors are same, Vdd is input direct voltage, the upper comparator's 210 trigger voltage is ⅔ Vdd, the lower comparator's 220 trigger voltage is ⅓ Vdd. When the power is provided to the oscillator 200, the capacitor is charged through the first match resistor 270 and the second match resistor 280. The lower comparator 220 drives the inverter driven stage 250 to output a high level signal through a flip-flop 230, and turn-off the discharge transistor 240 to continue charging the capacitor 290. After the capacitor's 290 cross voltage is charged to ⅔ Vdd, the upper comparator 210 outputs a high level signal to make flip flop 230 to drives inverter driven stage 250 to output a low level signal, then the charge transistor 240 is turned on. The capacitor 290 is discharged through the second match resistor 280. After the capacitor's 290 cross voltage is discharged to ⅓ Vdd, the charge mode come back again.

Referring FIG. 2.1 is the relation of a conventional close-loop oscillator's Vc curve and Vo curve. The oscillator's 200 charge-discharge current and comparative voltage (⅓ Vdd & ⅔ Vdd) will change upon the Vdd, thus the frequency of oscillator 200 will change correspondingly.

SUMMARY OF THE INVENTION

In order to solve the problems mentioned above, the present invention provides a comparator with a self-biased reference voltage, which is independent from the external voltage change, for an oscillator. The comparator includes a depletion MOS network and an enhanced MOS network One embodiment of the present invention provides a comparator for an oscillator. The comparator has a depletion MOS that utilizes relative temperature characteristics among electric units to make a comparative voltage be independent from the temperature change.

Accordingly, another embodiment of the present invention provides an oscillator circuit internally having a comparative voltage independent from the external voltage change and generating a stable frequency without the affection of external voltage change.

In one aspect of the invention, an oscillator with a comparator is implemented, which has a comparative voltage independent from the external voltage change and can generate the frequency without the affection of temperature change.

In another aspect of the invention, an oscillator with a comparator in a self-testing digital phase-locked loop is implemented, which may provide a great deal of flexibility by adjusting the parameters in the manufacturing process.

In one embodiment, the comparator with a self-biased reference voltage for an oscillator includes: a depletion MOS network to form a constant current source, wherein the gate and the source of the depletion MOS are electrically coupled together; and an enhanced MOS network, wherein the drain or the source is electrically connected to the depletion MOS in series, the gate of the enhanced MOS receives an input voltage, and the comparator outputs a high level voltage when the input voltage is lower than a reference voltage, or the enhanced MOS outputs a low level voltage when the input voltage is higher then the reference voltage.

In another embodiment, the comparator with a self-biased reference voltage for an oscillator includes: a current source to provide the oscillator a charge current; a capacitor network connected to a reference point to electrically couple with the current source to charge or discharge; a switch connected to the reference point to electrically couple with the capacitor network to control the charge or discharge of the capacitor network; a comparator connected to the reference point to electrically couple with the switch, wherein the comparator has a reference voltage independent from a voltage source, and compares the voltage of the capacitor network with the reference voltage, then outputs an output signal; and an inverter network electrically connected to the switch to electrically couple with the comparator, wherein the inverter network receives the output signal and outputs an inverse signal to control the switch.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein:

FIG. 2.1 is the relation between Vc and Vo in a comparator for a conventional close-loop oscillator;

FIG. 3.1 is a circuit diagram of a comparator in accordance with one embodiment of the present invention;

FIG. 3.2 is a circuit diagram of the comparator in FIG. 3.1;

DETAILED DESCRIPTION OF THE INVENTION

Figure 1:
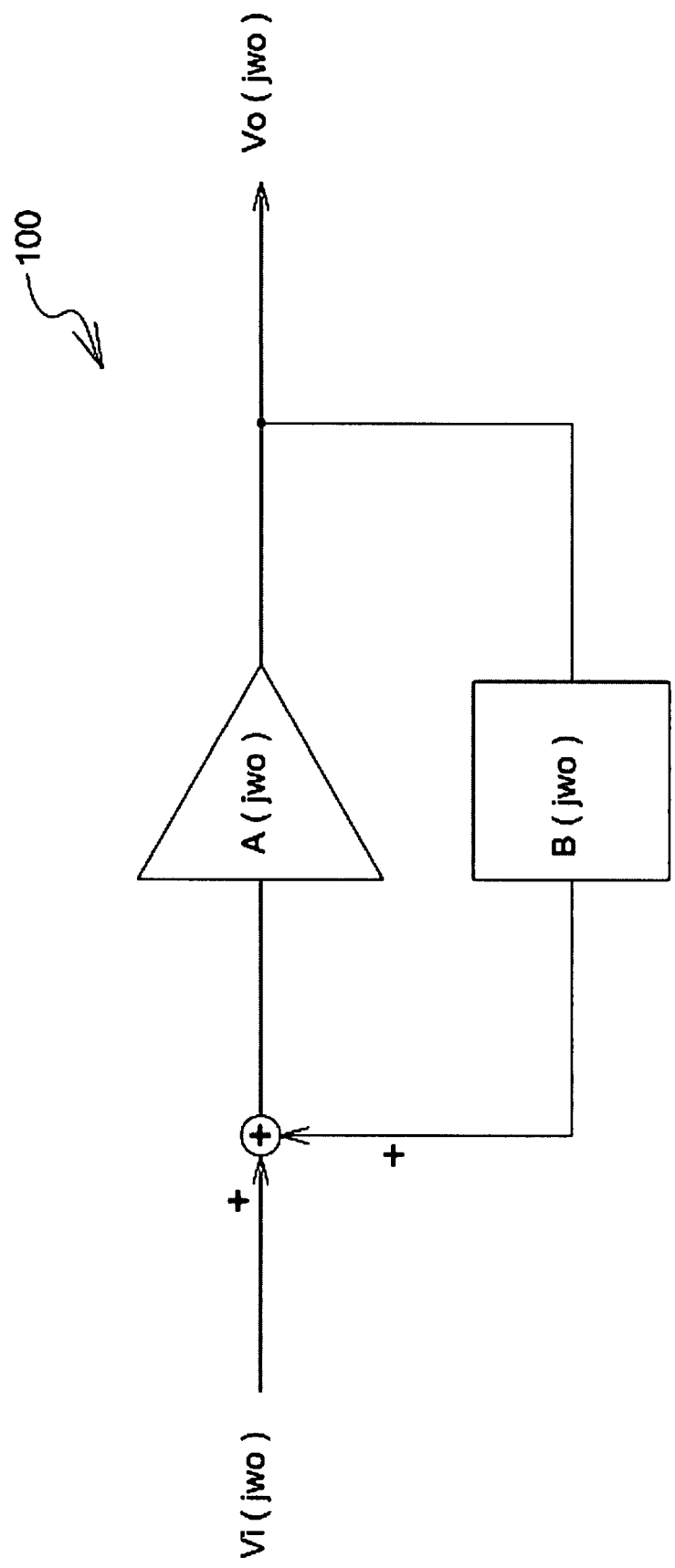
FIG. 1 is a block diagram of a conventional close loop oscillator circuit.
Figure 2:
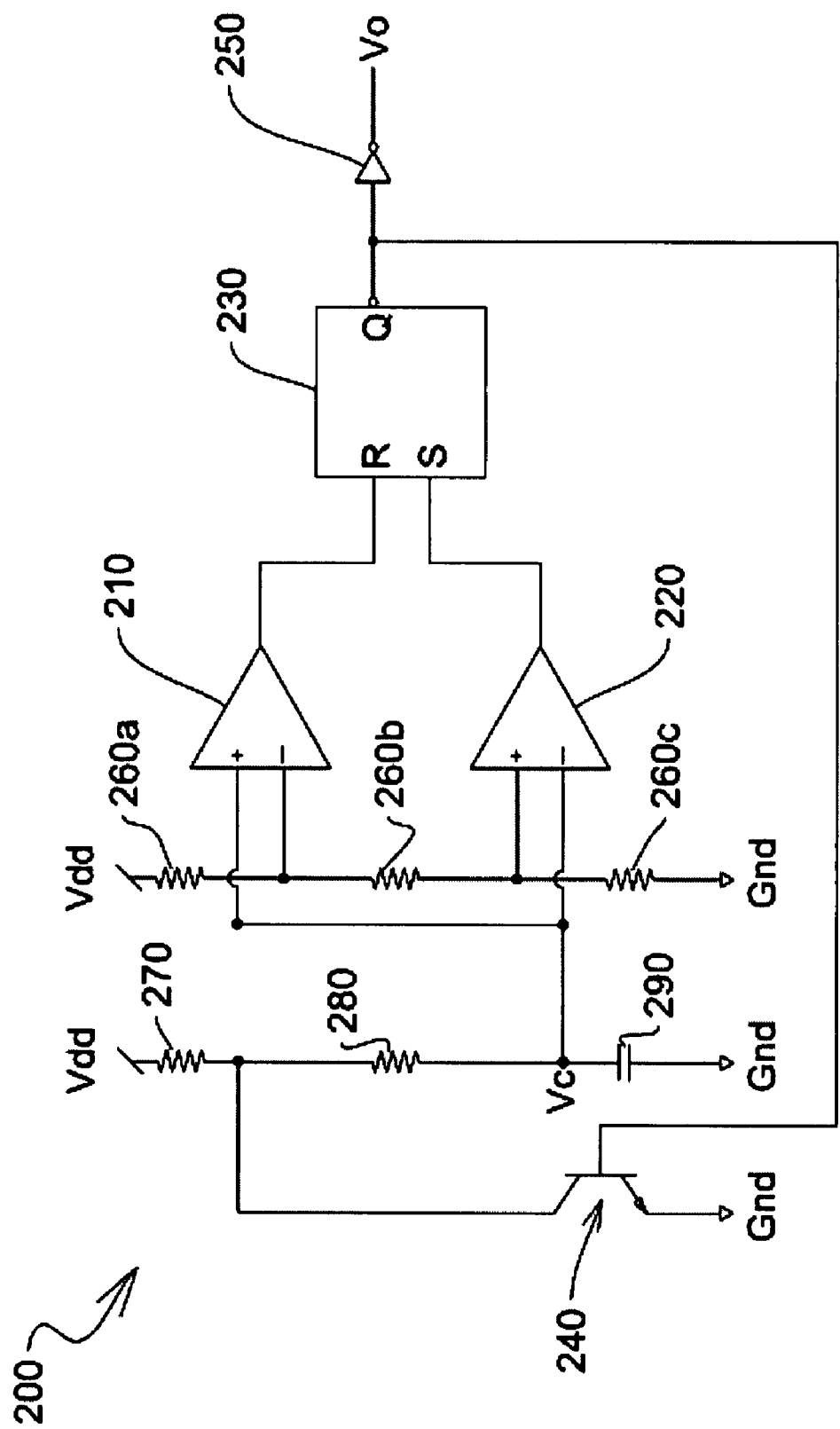
FIG. 2 is a circuit diagram of a conventional oscillator circuit.
Figure 3:
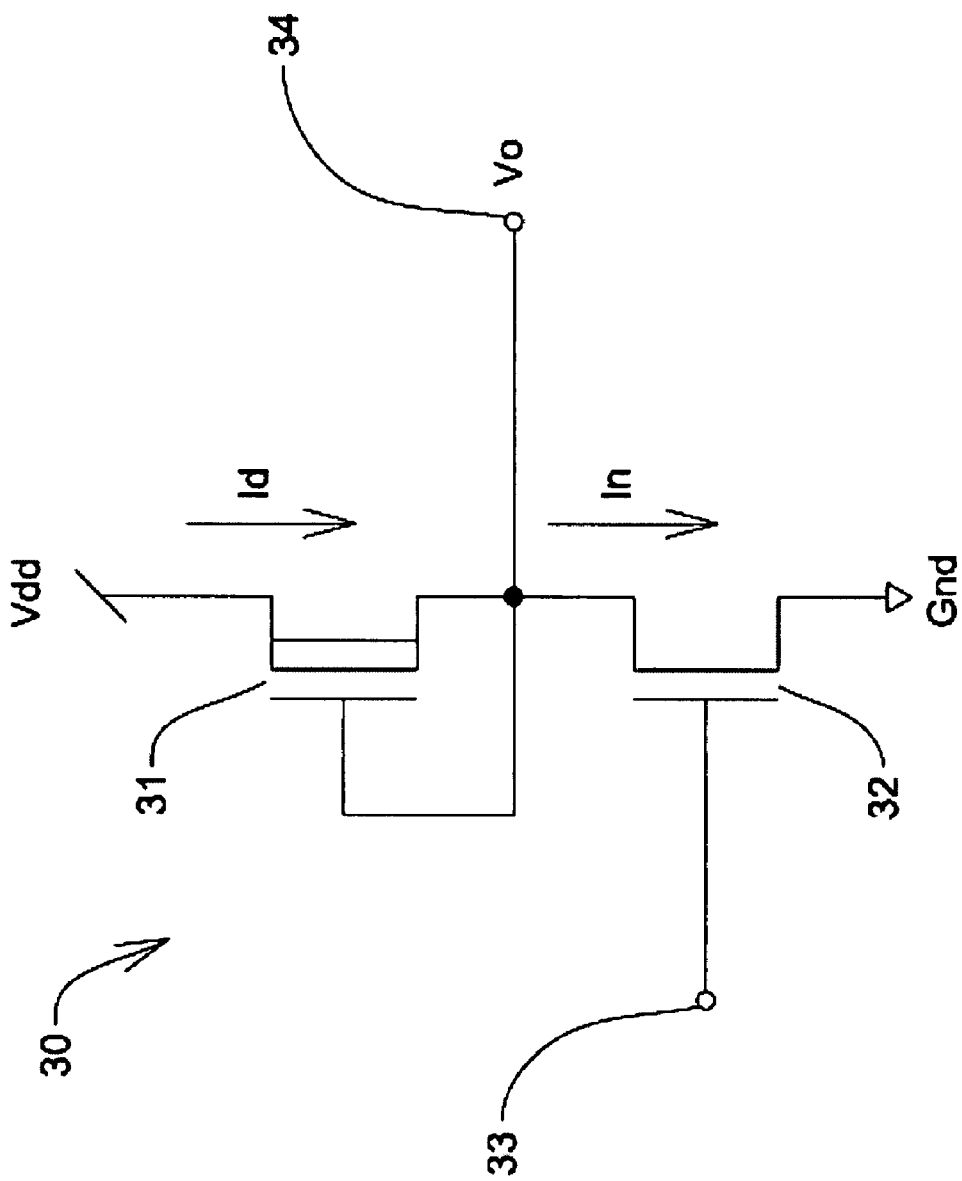
FIG. 3 is a circuit diagram of a comparator in accordance with one embodiment of the present invention.

FIG. 3 is a circuit diagram of a comparator with a self-biased reference voltage for an oscillator in accordance with one embodiment of the present invention. The comparator 30 includes a depletion MOS network 31, an enhanced MOS network 32, an input end 33 and an output end 34. The depletion MOS network 31 connects to the enhanced MOS network 32 in series, and its gate and source are electrically coupled together. Thus the depletion MOS network 31 can be a current source. The input end 33 is electrically coupled to the gate of the enhanced MOS network 32, and the output end 34 is electrically coupled with the gate and source of depletion MOS network 31, which drain is coupled with the power supply Vdd.

In FIG. 3.1 the input end 33 is coupled with the output end 34, thus the circuit in the FIG. 3.1 shows a stable voltage circuit independent from the external voltage change or the temperature change. In this stable voltage circuit, the output voltage in the output end 34 equals to the reference voltage Vref, which is independent from the power supply Vdd and the temperature change, wherein the reference voltage Vref equals to the comparative voltage of the comparator 30. FIG. 3.2 shows another circuit diagram of a comparator in accordance with one embodiment of the present invention. The characteristic of the reference voltage Vref is independent from the power supply Vdd and the temperature change will be described in the following:

Firstly, in the FIG. 3.1, the current Id in the depletion MOS network 31 equals to the current In in the enhanced MOS network 32. Because the depletion MOS network 31 has a channel and its gate is coupled with its source (Vgsd=0). When the depletion MOS transistor is saturated, the current Id will not affected by the external voltage owning to the physical phenomenon of the semiconductor.

So, the Equation (1) and (2) can be obtain:

$$I_d = \frac{1}{2} k_d \frac{W_d}{L_d} (V_{gsd} - V_{td})^2 \qquad (1)$$

and $Id = In$, $$Vgsn = Vtn + \sqrt{\frac{Kd}{Kn} * \frac{(w/L)_d}{(w/L)_n}} * Vtd \qquad (2)$$

Wherein Kd and $K_n$ are semiconductor constants, Wd and Ld are width and length, Wn and Ln are width and length, $V_{td}$ and $V_{tn}$ are threshold voltage. Vgsn is the voltage difference between the gate and source of the enhanced MOS network 32, also means that the reference voltage Vref comes from the output end 34 and the comparative voltage of the comparator 30.

Accordingly, Vgsn can be expressed in equation (3).

$$Vgsn = Vtn + \sqrt{\frac{Kd}{Kn} * \frac{(w/L)_d}{(w/L)_n}} * Vtd \qquad (3)$$

The comparative voltage is independent from the power supply Vdd, and can be obtained in the manufacturing process by adjusting the width and length of MOS.

Accordingly, the present invention has a comparative voltage independent from the temperature change, the reason is that the comparator 30 has the corresponding units for their own thermal effect. By setting manufacturing parameters, the thermal effect will be offset through the MOS transistor's characteristics. Consequently, the temperature will not affect the comparative voltage of the comparators 30.

The circuit's operation of the comparator 30 is described in the following. The input end 33 is coupled with the gate of enhanced MOS network 32. When the input voltage in the input end 33 is less than the comparative voltage, the current In is transmitted through the enhanced MOS network 32 to become smaller and cause a high level voltage output. If the input voltage in the input end 33 is higher than the comparative voltage, the current In is transmitted through the enhanced MOS network 32 to become bigger and cause a low level voltage output. Although it needs time to transform the high output voltage to the low output voltage, the reaction time is relative small. It makes the comparator 30 to have the comparative voltage be a threshold level and output the signal with two level voltages (such as high/low, or on/off). Moreover, the comparator 30 is independent from the external voltage change and temperature change, thus the present invention is very suitable for an oscillator.

Figure 4:
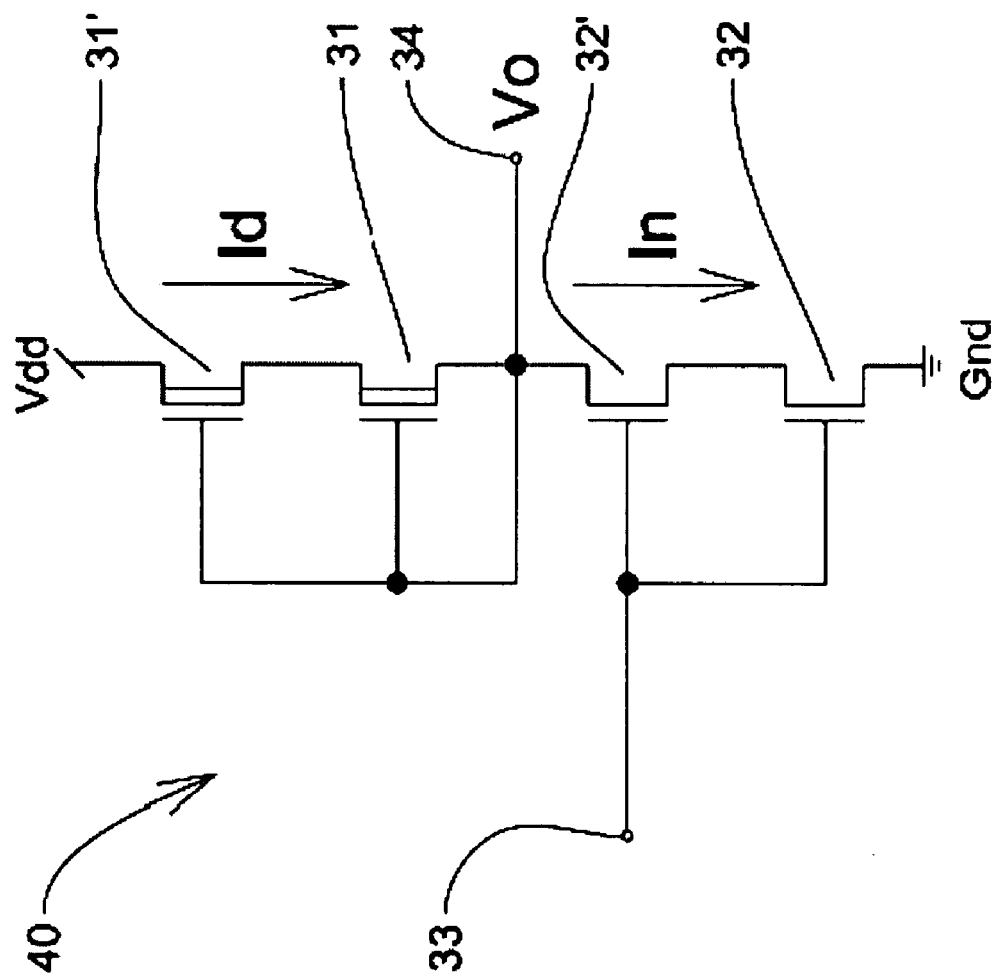
FIG. 4 is a circuit diagram of a comparator in accordance with one embodiment of the present invention.

Most noticeably, in FIG. 3, an enhanced MOS and a depletion MOS are used, but the quantity of MOS shall not be restricted in the present invention. The comparator has the corresponsive numbers of enhanced MOS transistors and depletion MOS transistors according the spirit of the present invention. FIG. 4 shows another embodiment of the comparator according the present invention. The comparator 40 includes two enhanced MOS transistors and two depletion MOS transistors, it can achieve the functions as described in the embodiment of FIG. 3. Moreover, the enhanced MOS transistor 32' and the depletion MOS transistor 31' can provide high impedance for the comparator 40 and make it resistant to the external voltage change and temperature change.

Figure 5:
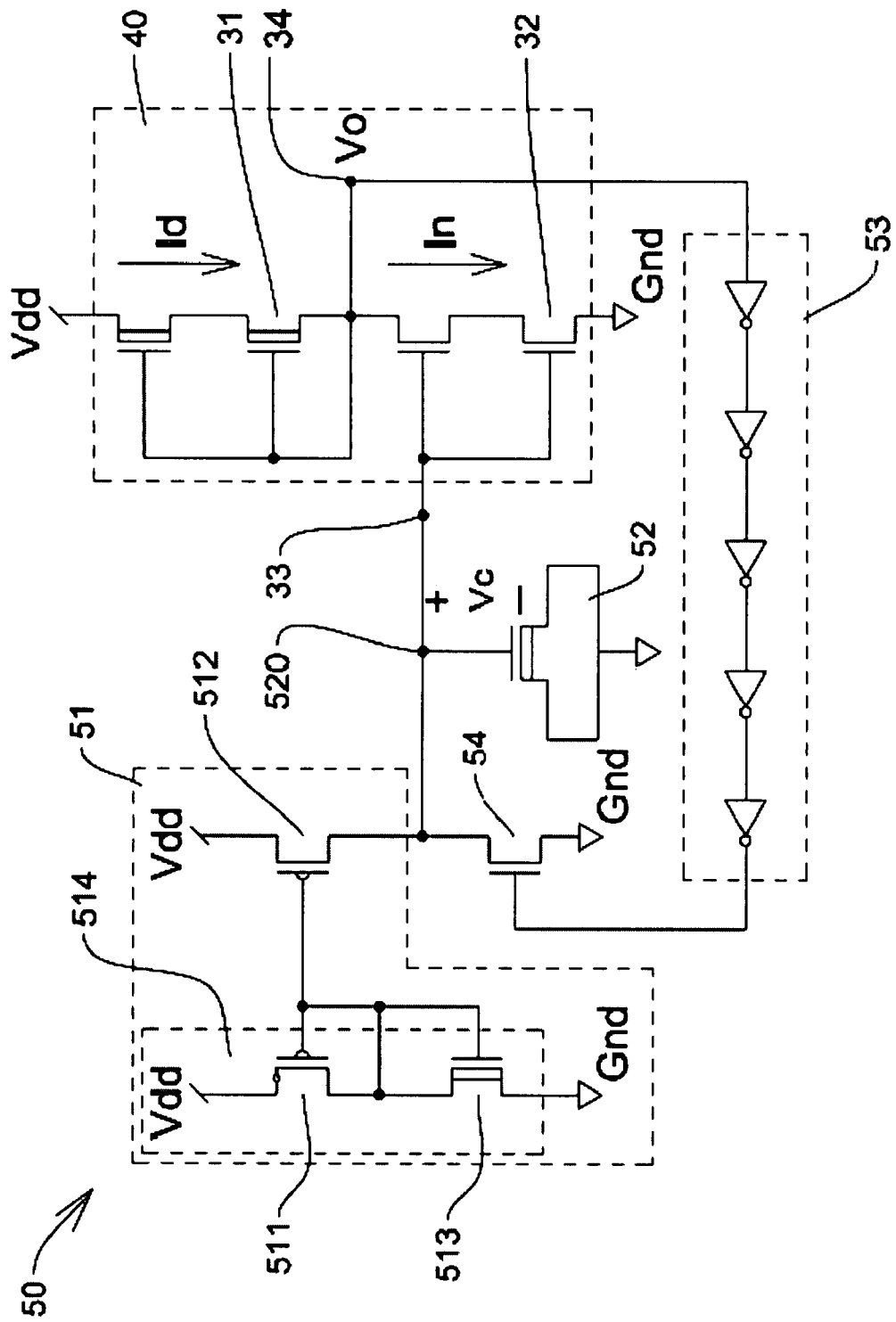
FIG. 5 is a circuit diagram of an oscillator in accordance with one embodiment of the present invention.

FIG. 5 is a circuit block diagram of an oscillator in accordance with one embodiment of the present invention. The oscillator 50 includes a current source 51, a capacitor 52, an inverter 53 and a switch 54. The current source 51 includes two enhanced MOS transistors 511,512 and one depletion MOS transistor 513 to form a stable voltage circuit which is independent from the external voltage change and the temperature change as mentioned above. The gates of enhanced MOS transistors 511 and 512 are coupled with each other to form a mirror circuit and make the depletion MOS transistor 513 and enhanced MOS transistors 511,512 to be a current source 51. The current source 51 outputs a current Im. The drain of enhanced MOS transistor 512 connects to a node 520 to electrically couple with a switch 54. The capacitor 52 connects to the node 520 to electrically couple with the current source 51 and switch 54. The input of comparator 40 connects to the node 520 to electrically couple with the current source 51, capacitor 52 and switch 54. The output of the comparator 40 is electrically coupled with the input of the inverter 53, and the output of the inverter 53 is electrically coupled with another end of switch 54.

Accordingly, the operations of the oscillator compose charge mode and discharge mode, which is described in the following:

Charge mode: during a charge period, the switch 54 turns off to cause the current Im flowing to the capacitor 52 and raise the cross voltage Vc, so the voltage in the input end 33 rises with the voltage Vc.

Discharge mode: when the voltage Vc equals to comparative voltage, the oscillator is in a discharge mode. The output of the comparator 40 switches to low level signal which is transmitted to inverter 53, then the high level signals are output to turn on the switch 54 and make the capacitor 52 be grounded. The electrical energy in the capacitor 52 decreases through the ground and make the voltage Vc decrease, too. The voltage in the input of comparator 40 is lower than the comparative voltage, thus the output of comparator 40 switches to the high level signal which is transmitted to the inverter 53, then low level signals are output to turn off the switch 54 and make the capacitor 52 charge in next circle.

Accordingly, the capacitor 52 is formed using a depletion MOS transistor whose drain and source are coupled together, but it does not to restrict the present invention.

The current source 51 can provide a stable charge current to or a stable discharge current.

Besides, for avoiding the switch 54 not reflecting the change of the output signal from comparator 40, the inverter 53 must have a delay time characteristic. Although the inverter 53 includes odd number of inverters connected in series, as the person skilled in the art knows, the inverter 53 may be only one inverter to have enough delay time.

Figure 6:
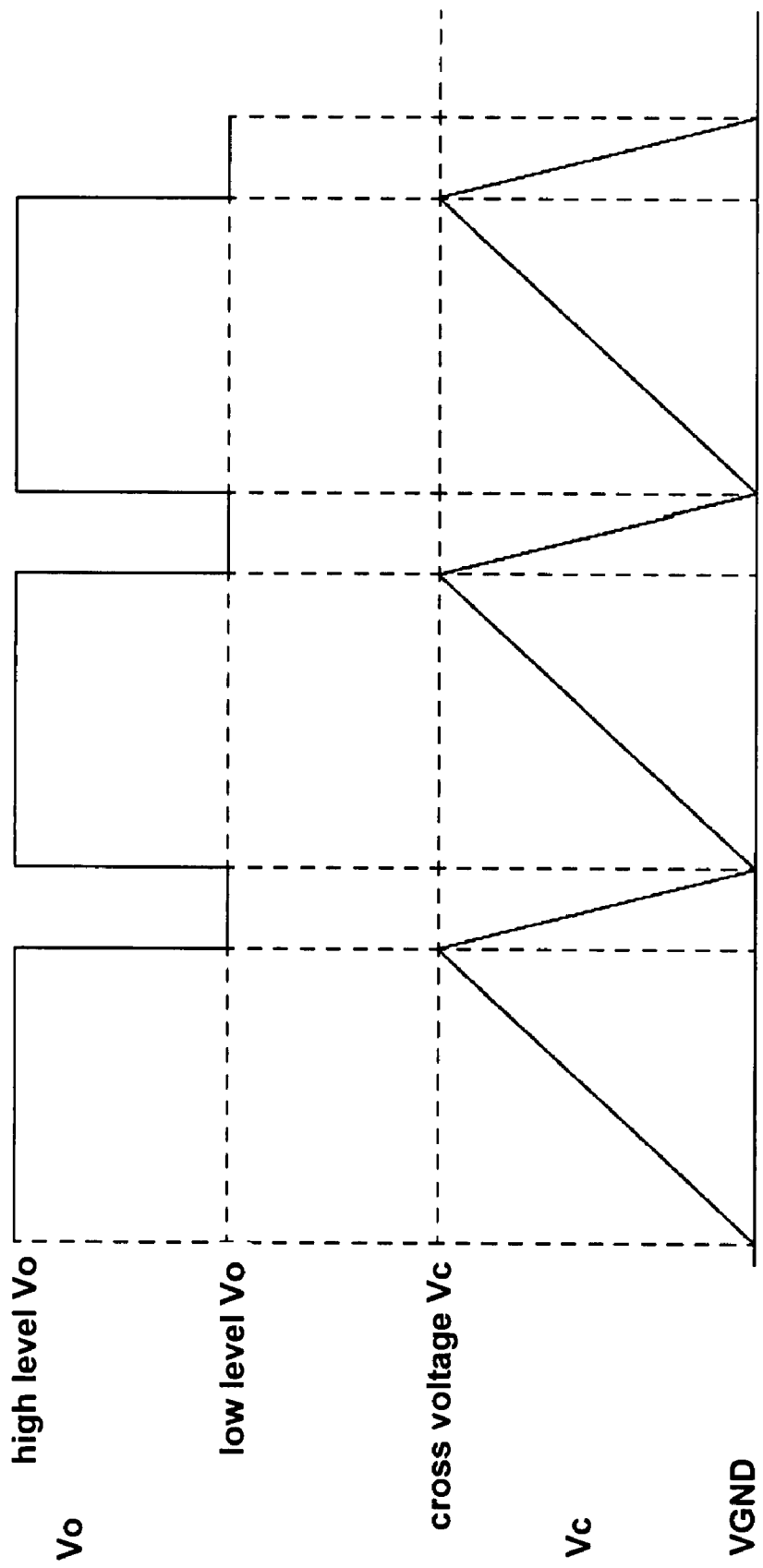
FIG. 6 is the relation between Vc and Vo in an oscillator in accordance with one embodiment of the present invention.

FIG. 6 is the relation between the capacitor voltage and output voltage in accordance with one embodiment of the present invention. By utilizing the comparator 40 and the current source 51, the characteristic curve of the oscillator 50 is almost the same with the ideal signal. Firstly, by using the constant current unit, the charge operation is not affected by the non-linear situation produced from the voltage difference among the resister units. Secondly, by using the characteristic of the stable current source 51 that is independent from the external voltage change and the temperature change, the charge current keeps steady. Thirdly, by using the characteristic of the comparator 51 that is independent from the external voltage change and the temperature change, the frequency of the oscillator also keeps steady. So an oscillator with stable charge and frequency, which keeps off external voltage and temperature effect, can be achieved.

Figure 7:
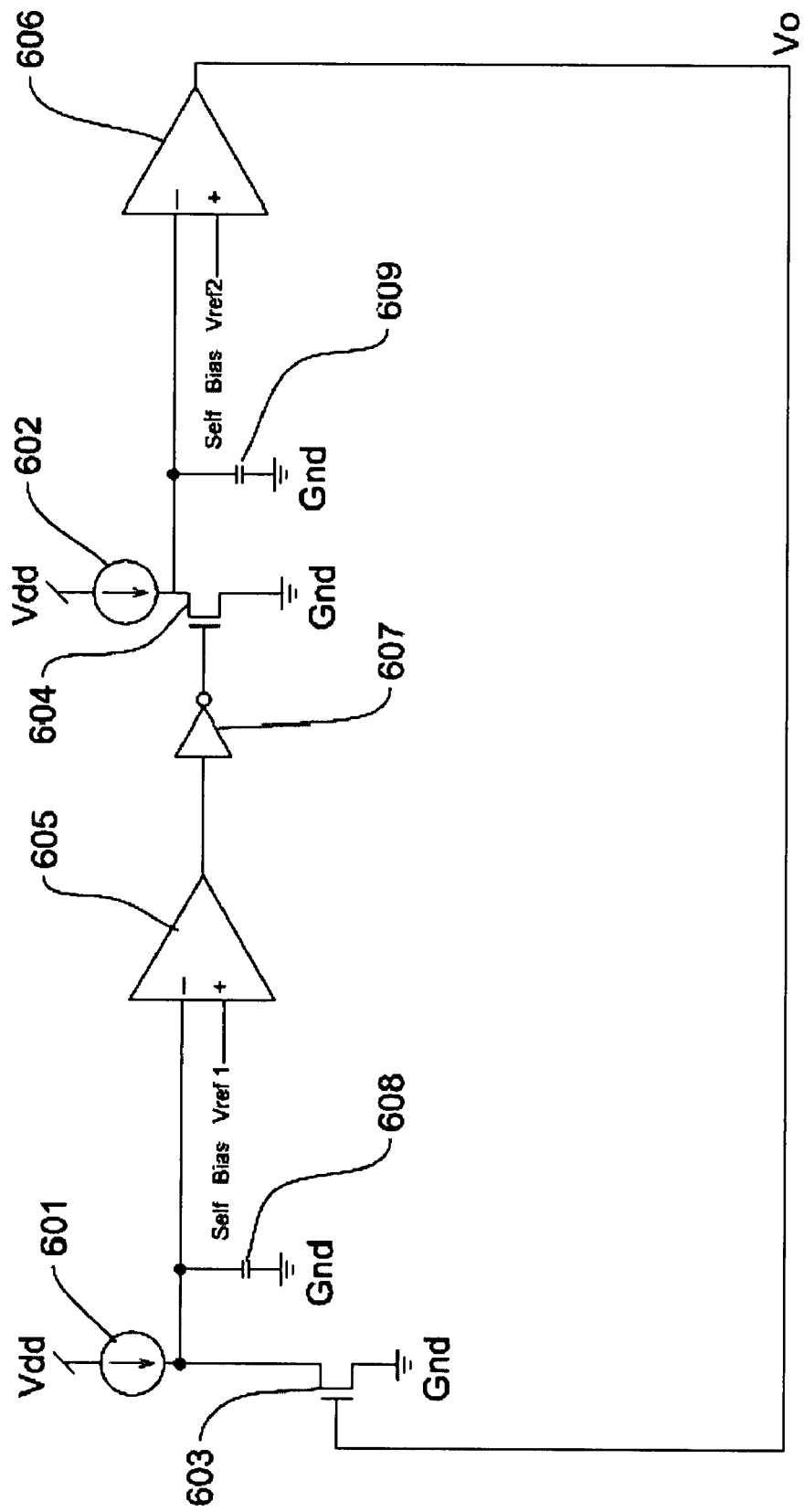
FIG. 7 is a circuit diagram of an oscillator in accordance with one embodiment of the present invention.

FIG. 7 is a circuit diagram of an oscillator in accordance with one embodiment of the present invention. An oscillator 60 includes a first current source 601, a second current source 602, a first switch 603, a second switch 604, a first comparator 605, a second comparator 606, a first capacitor 608, a second capacitor 609 and an inverter 607. In this embodiment, the first current source 601 is the same as the current source 51 in FIG. 5, and the second current source 602 is any kind of known mirror circuit, thus the output current of the second current source 602 is proportional to the output current of first current source 601. Moreover, the first current source 601, the first switch 603, the first comparator 605 and the first capacitor network 608 are connected in the same way shown in FIG. 5. And the second current source 602, the second switch 604, the second comparator 606 and the second capacitor network 609 are also connected in the same way shown in FIG. 5. The output of first comparator 605 is coupled to one end of the inverter 607, the gate of second switch 604 is coupled to another end of the inverter 607, and the output of second comparator 606 is coupled to the gate of first switch 603. On this circuit, the oscillator 60 operates the same as oscillator 50 in FIG. 5. Owing to the first current source 601, the first comparator 605, the second current source 602 and the second comparator 606, the oscillator 60 can control the high level cycle and low level cycle in the output signal to precisely meet the requirement of the oscillation frequency. Noticeably, this embodiment connects inverter 607 to the first comparator 605 and the second switch 604, but in another embodiment the inverter 607 may connect to the second comparator 606 and the first switch 603. Besides, the person skilled in the art knows that the first current source 601 and the second current source 602 can be replaced by current source 51 described in FIG. 5, or any electric unit which can provide stable current to the oscillator 60.

Although the present invention has been explained in relation to its preferred embodiment, it is to be understood that other modifications and variation can be made without departing the spirit and scope of the invention as hereafter claimed.

What is claimed is:

1. A comparator with a self-biased reference voltage for an oscillator, comprising:

a depletion MOS network to form a constant current source, wherein a gate and a source of said depletion MOS transistor are electrically coupled together;

an input end; and an enhanced MOS network, wherein a drain or a source of said enhanced MOS transistor is electrically connected to said depletion MOS transistor in series, a gate of said enhanced MOS transistor is electrically connected to said input end and receives an input voltage, and said comparator outputs a high level voltage when said input voltage is lower than said reference voltage, or said enhanced MOS transistor outputs a low level voltage when said input voltage is higher than said reference voltage.

2. The comparator with self-biased reference voltage for an oscillator of claim 1, wherein said comparator outputs said reference voltage when said input voltage equals with said reference voltage.

3. The comparator with self-biased reference voltage for an oscillator of claim 1, wherein said reference voltage is independent from an external voltage change.

4. The comparator with self-biased reference voltage for an oscillator of claim 1, wherein said reference voltage is independent from a temperature change.

5. The comparator with self-biased reference voltage for an oscillator of claim 1, wherein said depletion MOS network further includes a depletion MOS transistor.

6. The comparator with self-biased reference voltage for an oscillator of claim 1, wherein said enhanced MOS network further includes an enhanced MOS transistor.

7. The comparator with self-biased reference voltage for an oscillator of claim 1, wherein said constant source current is formed by coupling said gate to said source.

8. The comparator with self-biased reference voltage for an oscillator of claim 4, wherein said constant source current is formed by coupling said gate to said source.

9. The comparator with self-biased reference voltage for an oscillator of claim 5, wherein said reference voltage is the sum of an end voltage of said depletion MOS network and an end voltage of said enhanced MOS network.

10. The comparator with self-biased reference voltage for an oscillator of claim 5, wherein said reference voltage is adjusted in a manufacturing process for said depletion MOS network and said enhanced MOS network.

11. An oscillator, comprising:

a current source providing said oscillator a charge current, wherein said current source includes a depletion MOS network and two enhanced MOS networks;

a capacitor network connected to a reference point to electrically couple with said current source to charge or discharge;

a switch connected to said reference point to electrically couple with said capacitor network to control the charge or discharge of said capacitor network;

a comparator connected to said reference point to electrically couple with said switch, wherein said comparator has a reference voltage independent from a voltage source, and compares the voltage of said capacitor network with said reference voltage, then outputs an output signal; and an inverter network electrically connected to said switch to electrically couple with said comparator, wherein said inverter network receives said output signal and outputs an inverse signal to control said switch.

12. The oscillator of claim 11, wherein said current source outputs a current which is independent from said voltage source to charge said capacitor network.

13. The oscillator of claim 11, wherein said output signal includes at least two kinds of level.

14. The oscillator of claim 11, wherein said charge current is independent from a change of voltage source.

15. The oscillator of claim 11, wherein said reference voltage is independent from a temperature change.

16. The oscillator of claim 14, wherein said reference voltage is independent from a temperature change.

17. The oscillator of claim 11, wherein said comparator includes a depletion MOS network and an enhanced MOS network.

18. The oscillator of claim 17, wherein said depletion MOS network includes at least a depletion MOS transistor.

19. The oscillator of claim 17, wherein said enhanced MOS network includes at least an enhanced MOS transistor.

20. The oscillator of claim 17, wherein at least one drain or source of said enhanced MOS transistor is connected with corresponding said depletion MOS transistor in series, further its gate receives an input voltage, and said comparator outputs a high level signal when said input voltage is lower than said reference voltage, or outputs a low level signal when said input voltage is higher than said reference voltage.

21. The oscillator of claim 11, wherein said inverter network has delay time characteristic to reflect a change of said output signal.

22. The oscillator of claim 11, wherein said inverter network includes odd number of inverters.

23. The oscillator of claim 17, wherein said reference voltage is the sum of an end voltage said depletion MOS network and an end voltage of said enhanced MOS network.

24. The oscillator of claim 17, wherein said reference voltage is adjusted in a manufacturing process for said depletion MOS network and said enhanced MOS network.

* * * * *